United States Patent
Biber et al.

(10) Patent No.: US 9,805,964 B2
(45) Date of Patent: Oct. 31, 2017

(54) SYSTEM AND METHOD FOR MULTI-LOCATION ZAPPING

(71) Applicant: APPLIED MATERIALS ISRAEL LTD., Rehovot (IL)

(72) Inventors: Tuvia Biber, Rishon-Lezion (IL); Efim Kerner, Rehovot (IL); Efraim Siman Tov, Rehovot (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 15/069,943

(22) Filed: Mar. 14, 2016

(65) Prior Publication Data

US 2017/0263485 A1    Sep. 14, 2017

(51) Int. Cl.
*H01L 21/326* (2006.01)
*H01L 21/683* (2006.01)
*H01L 21/66* (2006.01)

(52) U.S. Cl.
CPC ........ *H01L 21/6833* (2013.01); *H01L 21/326* (2013.01); *H01L 22/26* (2013.01)

(58) Field of Classification Search
CPC .... H01L 21/6833; H01L 22/26; H01L 21/326
See application file for complete search history.

(56) References Cited

U.S. PATENT DOCUMENTS

| | | | |
|---|---|---|---|
| 8,094,428 B2 | 1/2012 | Wang et al. | |
| 8,110,818 B2 | 2/2012 | Wang et al. | |
| 8,218,284 B2 | 7/2012 | Dou et al. | |
| 8,294,094 B1 | 10/2012 | Zhao et al. | |
| 8,604,428 B2 | 12/2013 | Wang et al. | |
| 8,908,348 B2 | 12/2014 | Wang et al. | |
| 2010/0288923 A1 | 11/2010 | Wang et al. | |
| 2011/0051306 A1* | 3/2011 | Wang | B82Y 10/00 361/212 |

* cited by examiner

*Primary Examiner* — Kyoung Lee
(74) *Attorney, Agent, or Firm* — Kilpatrick Townsend & Stockton LLP

(57) ABSTRACT

A system for zapping a wafer, the system may include a pulse generation unit that is configured to generate (a) first zapping pulses for causing a breakdown in a first location of a backside insulating layer of a wafer, and (b) second zapping pulses for causing a breakdown in a second location of the backside insulating layer of the wafer; a first conductive interface that is configured to convey the first zapping pulses to the first location, while contacting the first location; a second conductive interface that is configured to convey the second zapping pulses to the second location, while contacting the second location; and wherein the first location differs from the second location.

13 Claims, 16 Drawing Sheets

SYSTEM AND METHOD FOR MULTI-LOCATION ZAPPING

BACKGROUND OF THE INVENTION

A wafer can be irradiated by one or more charged particle beams during the manufacturing process of the wafer and even after the end of the manufacturing process of the wafer.

One unwanted side effect of the irradiation is the charging the wafer. The charging can be reduced and even eliminated by grounding the wafer.

A wafer may have a backside insulating layer that may prevent the grounding of the wafer. In order to allow the grounding there is a need to form holes in the backside insulating layer.

The Holes may be formed in the backside insulating layer by zapping the backside insulating layer. The zapping includes supplying high power voltage pulses (referred to as zapping pulses) to the backside insulating layer. The zapping pulses cause a breakdown of the backside insulating layer.

The zapping process is a destructive process that damages the wafer.

There is a growing need to reduce the damage caused by the zapping pulses.

BRIEF SUMMARY OF THE INVENTION

According to an embodiment of the invention there may be provided a system for zapping a wafer, the system may include a pulse generation unit that may be configured to generate (a) first zapping pulses for causing a breakdown in a first location of a backside insulating layer of a wafer, and (b) second zapping pulses for causing a breakdown in a second location of the backside insulating layer of the wafer; a first conductive interface that may be configured to convey the first zapping pulses to the first location, while contacting the first location; a second conductive interface that may be configured to convey the second zapping pulses to the second location, while contacting the second location; and wherein the first location differs from the second location.

The system may include a controller that may be configured to control at least one out of an intensity of the zapping pulses, duration of the zapping pulses and an interval between adjacent zapping pulses.

The system may include a sensor that may be configured to monitor a coupling between the first conductive interface and the second conductive interface to provide a monitoring result; and wherein the sensor may be configured to monitor the coupling occurs while the second conductive interface contacts the second location and the first conductive interface contacts the first location.

The system may include a sensor that may be configured to monitor a coupling between the first conductive interface and the second conductive interface by sensing electrical signals that pass through the second conductive interface due to the first zapping pulses.

The system may include a sensor that may be configured to monitor a coupling between the first conductive interface and the second conductive interface by sensing electrical signals that pass through the first conductive interface due to the second zapping pulses.

The system may include a sensor that may be configured to monitor a coupling between the first conductive interface and the second conductive interface by sensing test signals that differ from the first zapping pulses and the second zapping pulses.

The first conductive interface may be coupled to the pulse generation unit via a resistor that may be configured to limit a current of the zapping pulses below a predefined current threshold.

The first conductive interface may be coupled to the pulse generation unit or via a resistive path.

The system may include an electrostatic chuck for supporting the wafer; and wherein the first conductive interface and the second conductive interface are configured to pass through holes formed in the electrostatic chuck.

According to an embodiment of the invention there may be provided a method for zapping a wafer, the method may include generating, by a pulse generation unit, first zapping pulses and second zapping pulses; supplying, by a first conductive interface, the first zapping pulses to a first location of a backside insulating layer of a wafer thereby causing a breakdown of the backside insulating layer in the first location; and supplying, by a second conductive interface, the second zapping pulses to a second location of the backside insulating layer of a wafer thereby causing a breakdown of the backside insulating layer in the second location.

The method may include monitoring, by a sensor, a coupling between the first conductive interface and the second conductive interface to provide a monitoring result; and controlling, by a controller, the generating of the first zapping pulses and the second zapping pulses in response to the monitoring result.

The controlling of the generating of the first zapping pulses and the second zapping pulses may include stopping the generation of the first zapping pulses and the second zapping pulses when the monitoring result indicates that there is a breakdown in the first and second locations.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
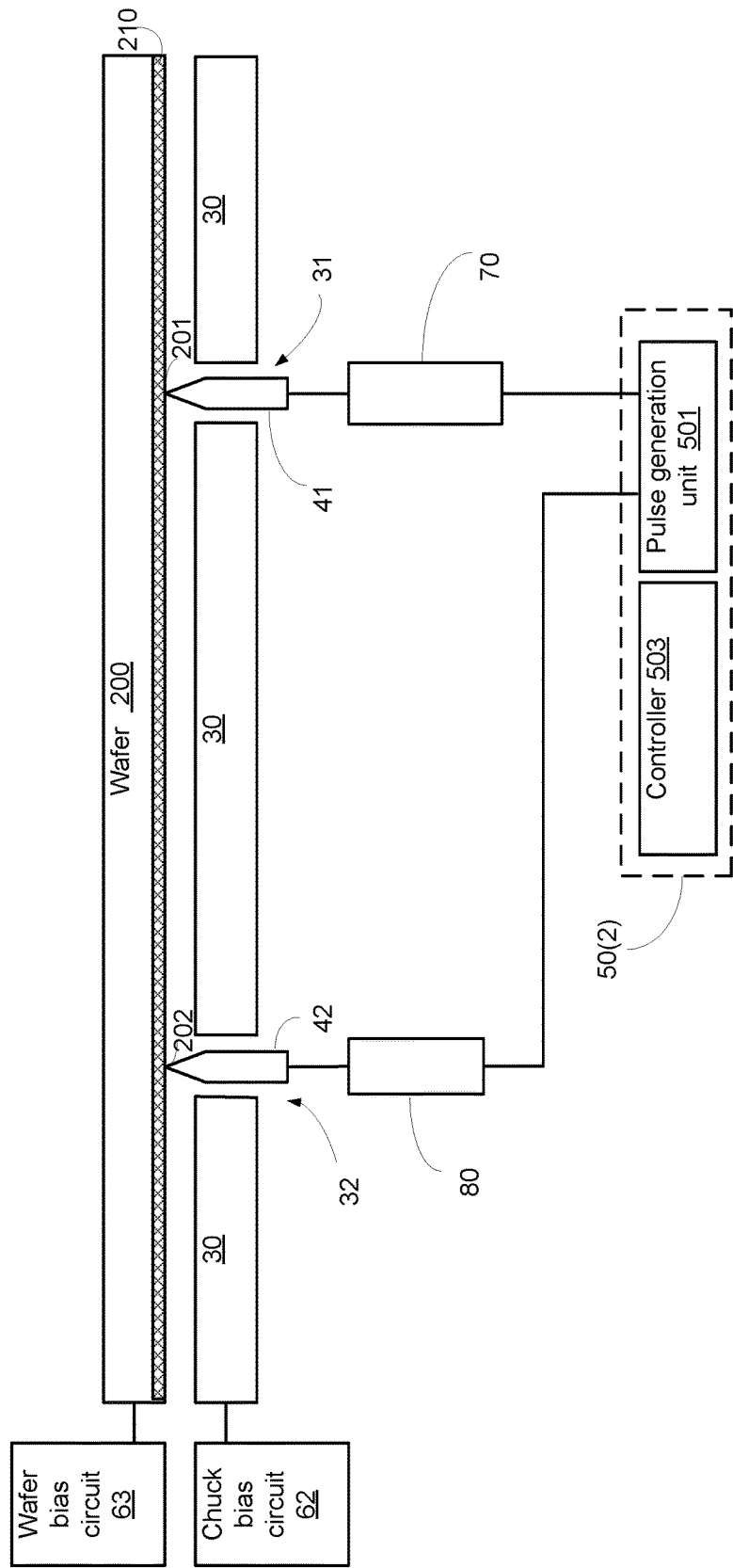
FIG. 1 illustrates a system and a wafer according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

It has been found that providing zapping pulses to a backside insulating layer of a wafer from multiple location may be beneficial. For example, providing zapping pulses through different conductive interfaces may overcome coupling problems between some of the conductive interfaces and the backside insulating layer. Yet for another example, a larger variety of zapping scenarios may be supported by providing zapping pulses through different conductive interfaces increases. The different zapping scenarios may be tailored to different wafer conditions (such as uneven backside insulating layer).

FIG. 1 illustrates a system 10(1) and a wafer 200 according to an embodiment of the invention.

Wafer 200 is illustrated as including backside insulating layer 210.

System 10(1) includes:
a. Wafer bias circuit 63 for biasing wafer 200.
b. Chuck 30 that includes spaces 31 and 32. Chuck 30 is configured to support wafer 200.
c. Chuck bias circuit 62 for biasing chuck 30.
d. First conductive interface 41 for supplying first zapping pulses to a first location 201 of backside insulating layer 210. First conductive interface 41 may also be configured to receive, under certain conditions, electrical signals resulting from the provision of second zapping pulses to a second location 202 of backside insulating layer 210 by the second conductive interface 42.
e. Second conductive interface 42 for supplying second zapping pulses to the second location 202 of the backside insulating layer 210. Second conductive interface 42 may also be configured to receive, under certain conditions, an electrical signal resulting from the provision of the first zapping pulses to the wafer 200 to first location 201 of backside insulating layer 210 by the first conductive interface 41.
f. Pulse generation unit 501 for generating the zapping pulses.
g. First network 70 for coupling the pulse generation unit 501 to the first conductive interface 41.
h. Second network 80 for coupling the pulse generation unit 501 to the second conductive interface 42.
i. Controller 503.

Each one of the first conductive interface 41 and the second conductive interface 42 may be shaped as a pin or may have any other shape. It is beneficial to contact the wafer with a tip or otherwise small cross section area.

The first conductive interface may be positioned within space 31.

The second conductive interface may be positioned within space 32.

Each one of the first network 70 and the second network 80 may be a conductor, a resistor, and the like.

According to an embodiment of the invention the first network 70 provides a resistive path between the pulse generator and the first conductive interface 41. The resistive path may exclude a capacitor or may have only an insignificant capacitance.

When providing a pulse through a capacitor—the capacitor discharges energy even after the pulse ends. Using a resistive path improves the control over the zapping pulses—as the resistive path allows to immediately stop the provision of energy to the wafer.

The first conductive interface 41 and the second conductive interface 42 may be electrically coupled to each other through wafer 200. Once breakdowns occur in first location 201 and in second location 202—an electrical signal may propagate through non-insulating layers of wafer 200.

Controller 503 may control the generation of the first and second zapping pulses. The first and second zapping pulses may overlap but conveniently do not overlap.

Controller 503 may be configured to control one or more parameter out of (i) the intensity of the first zapping pulses and/or the second zapping pulses, (ii) the duration of the first zapping pulses and/or second zapping pulses, and (iii) interval between adjacent first zapping pulses and/or second zapping pulses.

There may be tradeoff between the speed of achieving the breakdowns and between the amount of power or energy of one or more first and/or second zapping pulse that is provided to the wafer after the occurrence of the breakdowns.

One trade-off may involve reducing the intensity and/or the duration of the first and/or second zapping pulses over time in order to reduce the energy or power of the first and/or second zapping pulses generated closer to the occurrence of the breakdowns.

Controller 503 and pulse generation unit 501 form a pulse generating and controlling unit 50(1).

The pulse generating and controlling unit 50(1) can be biased and/or grounded.

Figure 2:
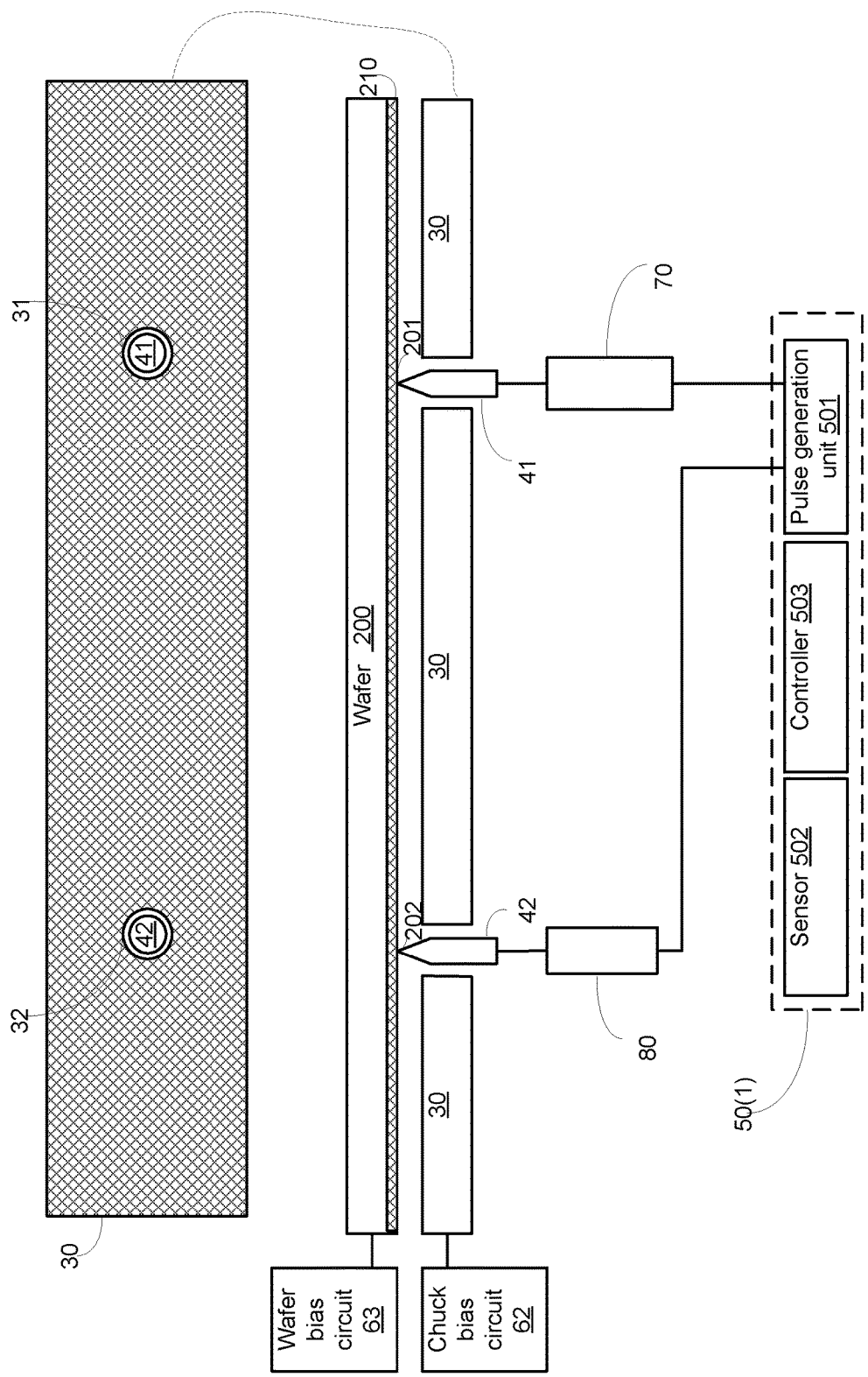
FIG. 2 illustrates a system and a wafer according to an embodiment of the invention.

FIG. 2 illustrates a system 10(2) and a wafer 200 according to an embodiment of the invention.

System 10(2) differs from system 10(1) by further including a sensor 502.

The sensor 502, controller 503 and pulse generation unit 501 may form pulse generating, sensing and controlling unit 50(2).

Until a breakdown occurs in both first and second locations the first conductive interface 41 and second conductive interface 42 are electrically isolated from each other. Signals that are sent through the first conductive interface 41 are not received by the second conductive interface 42 and vice verse.

After a breakdown occurs in both first and second locations the first conductive interface 41 and second conductive interface 42 are electrically coupled to each other. Signals that are sent through the first conductive interface 41 are received by the second conductive interface 42 and may be sensed by sensor 502. Signals that are sent through the second conductive interface 42 are received by the first conductive interface 41 and may be sensed by sensor 502. These signals may be first zapping pulses, second zapping pulses or test signals that are generated in order to test the occurrence of the breakdowns in the first and second locations.

Accordingly—sensor 502 may determine when breakdowns occur and may also determine the manner (or degree) in which the first conductive interface and the second conductive interface are electrically coupled to each other.

The sensor 502 may output a monitoring result that reflects the state of the backside insulating layer (especially occurrence of breakdowns in the first and second locations).

Controller 503 may receive the monitoring result and control the generation of the zapping pulses. The controlling may include instructing the pulse generating unit 501 to stop (even immediately) the generation of the first and/or second zapping pulses once a breakdown is detected. The term immediately may mean within few nanoseconds.

Figure 3:
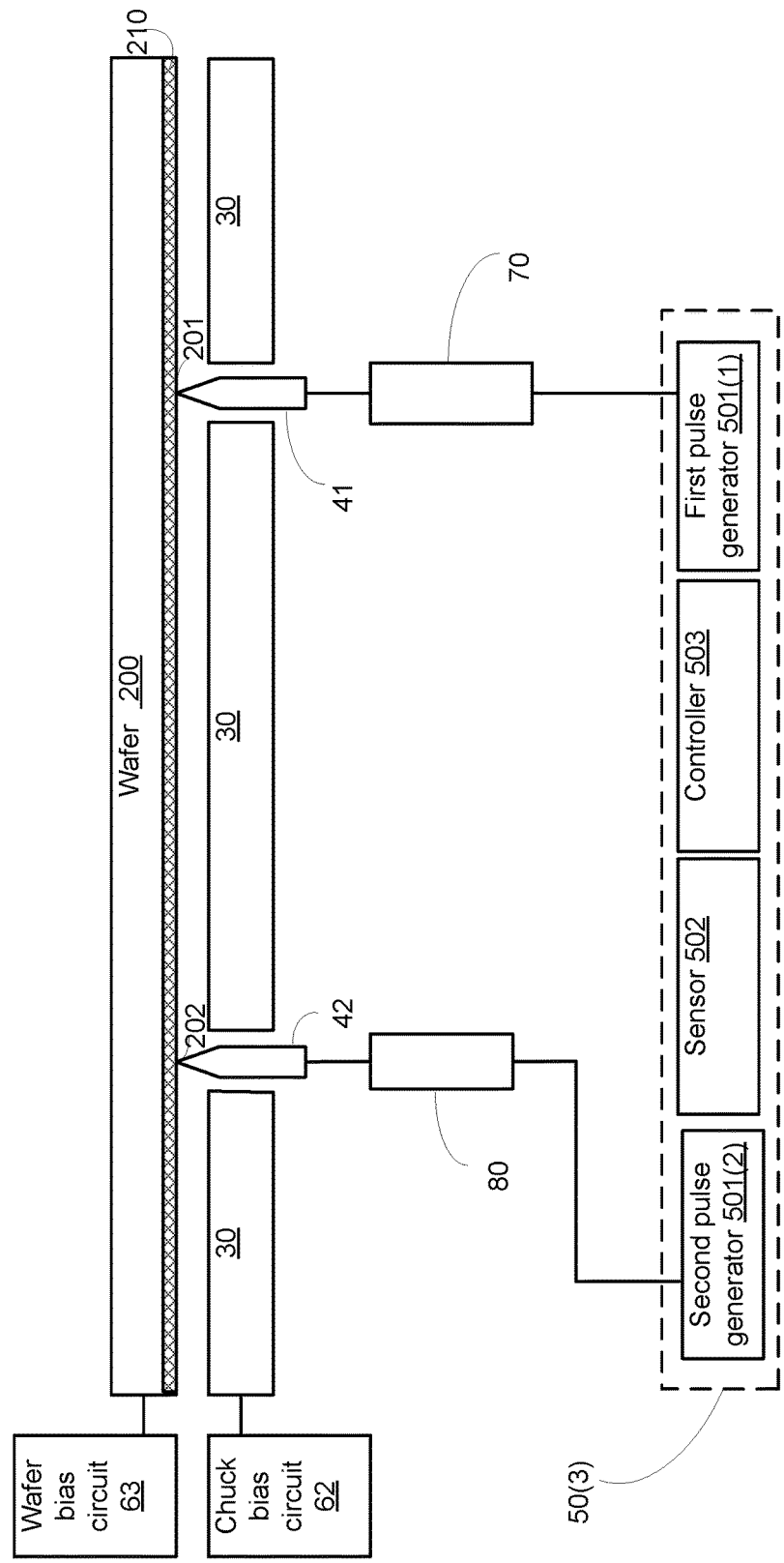
FIG. 3 illustrates a system and a wafer according to an embodiment of the invention.

FIG. 3 illustrates a system 10(3) and a wafer 200 according to an embodiment of the invention.

System 10(3) differs from system 10(2) by including (instead of pulse generation unit 501), (a) a first pulse generator 501(1) that is coupled to first network 70 for providing first zapping pulses to the first conductive interface 41 and (b) a second pulse generator 501(2) that is coupled to second network 80 for providing second zapping pulses to the second conductive interface 42.

The sensor 502, controller 503, first pulse generator 501(1) and second pulse generator 501(2) may form pulse generating, sensing and controlling unit 50(3).

Figure 4:
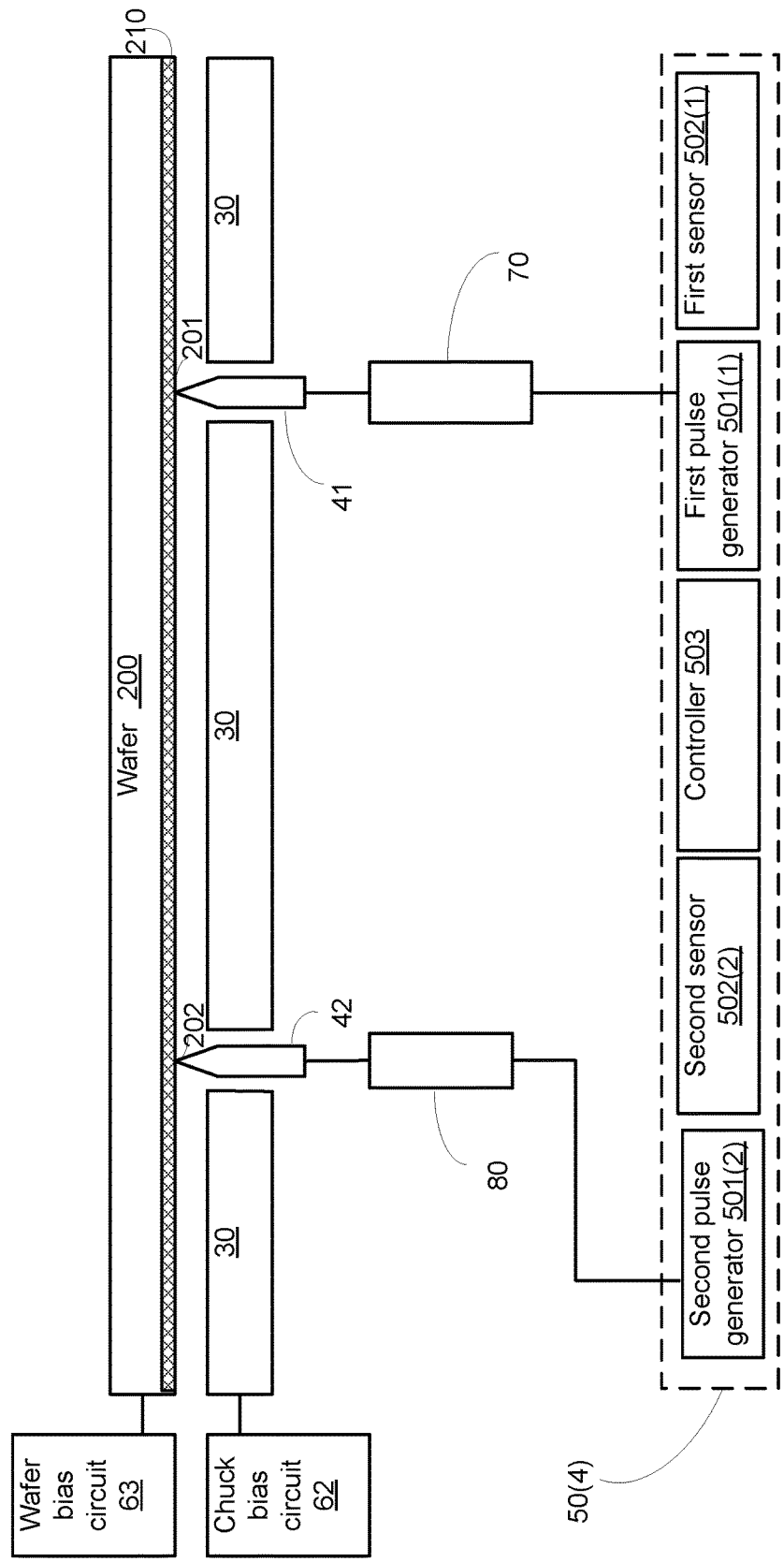
FIG. 4 illustrates a system and a wafer according to an embodiment of the invention.

FIG. 4 illustrates a system 10(4) and a wafer 200 according to an embodiment of the invention.

System 10(4) differs from system 10(3) by including (instead of sensor 502) a first sensor 502(1) for sensing signals that pass through first conductive interface 41, and a second sensor 502(2) for sensing signals that pass through second conductive interface 42.

The first sensor 502(1), second sensor 502(2), controller 503, first pulse generator 501(1) and second pulse generator 501(2) may form pulse generating, sensing and controlling unit 50(4).

FIGS. 1, 2, 3 and 4 illustrate the backside insulating layer 210 before the formation of the breakdowns.

Figure 5:
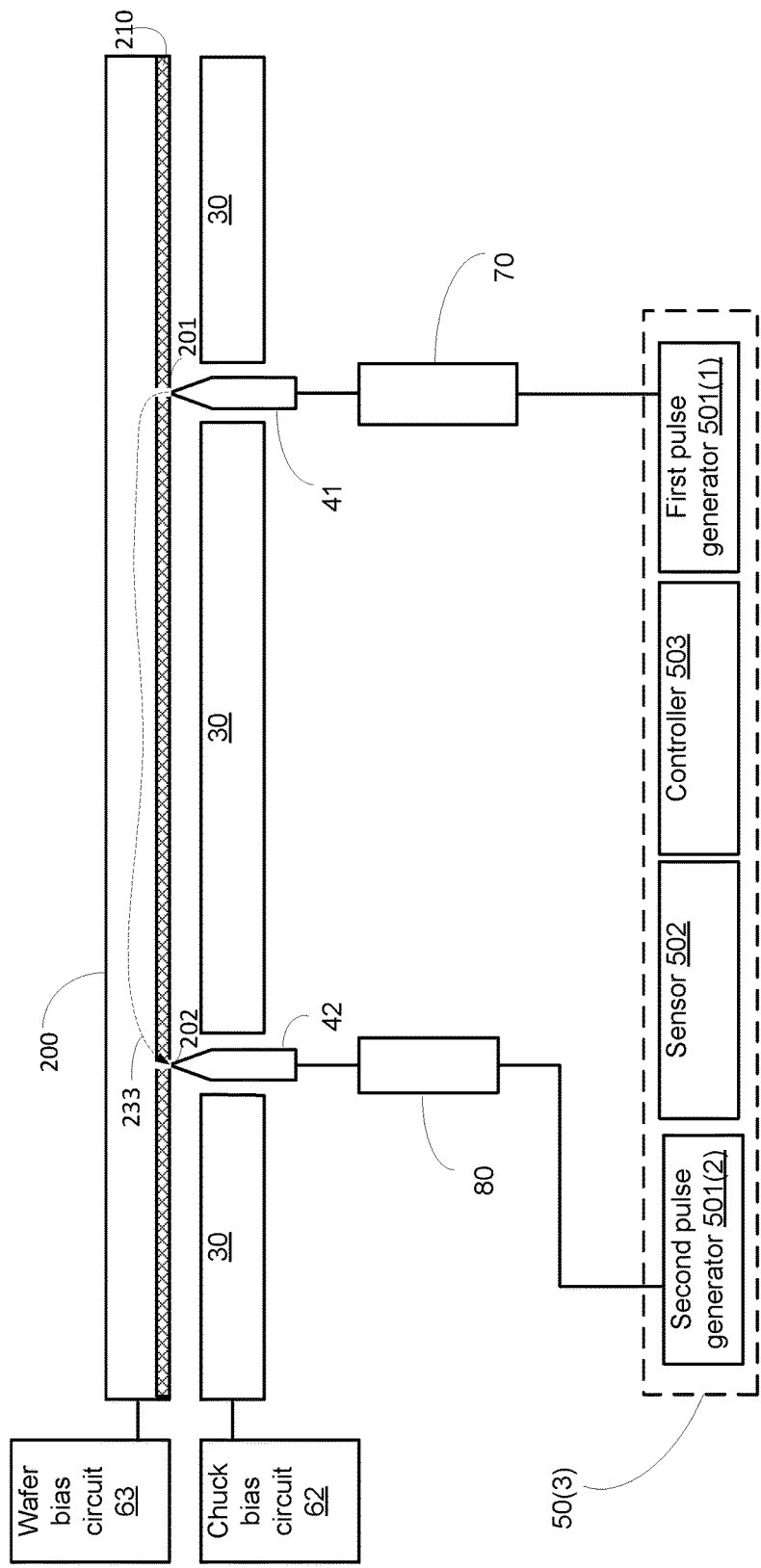
FIG. 5 illustrates a system and a wafer according to an embodiment of the invention.
Figure 6:
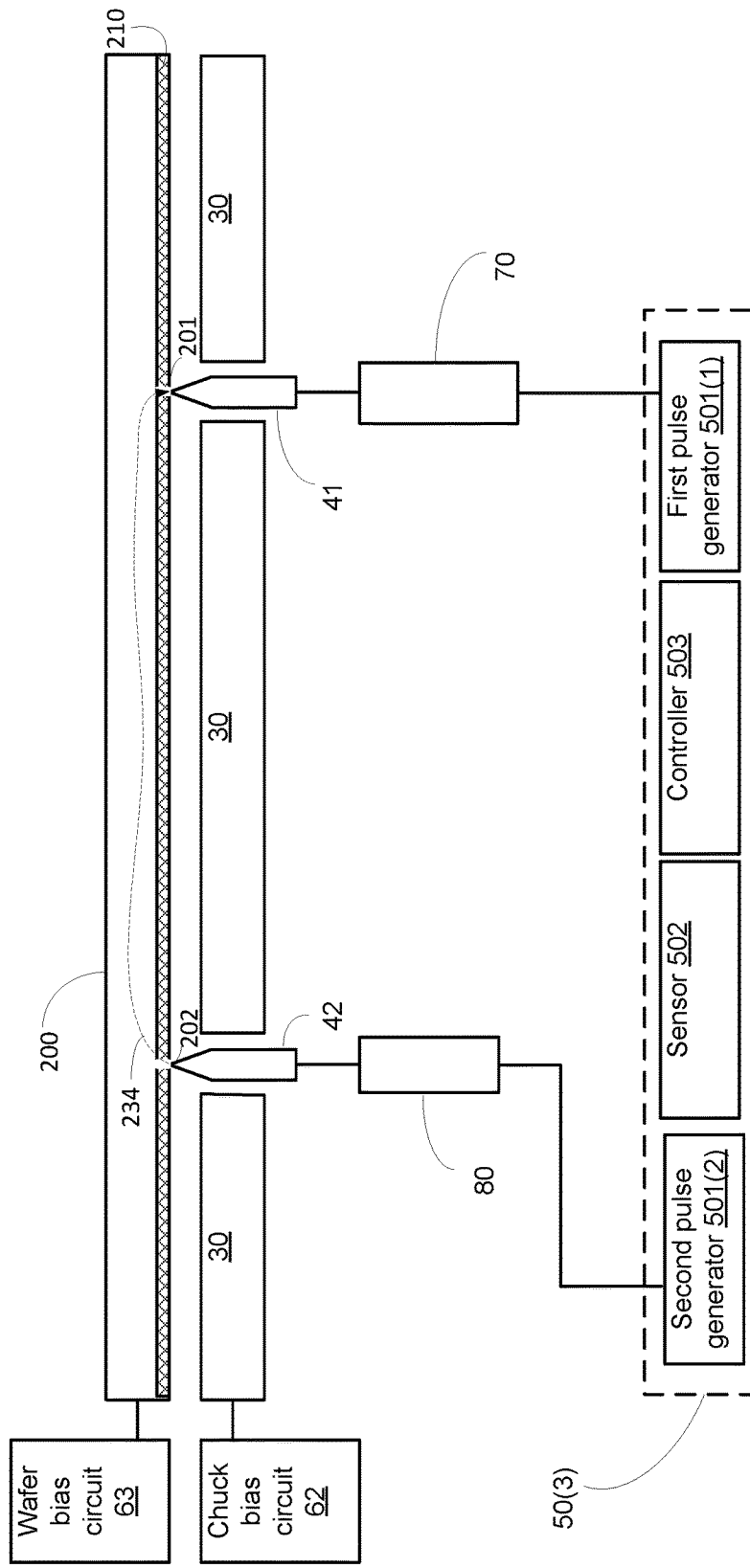
FIG. 6 illustrates a system and a wafer according to an embodiment of the invention.

FIGS. 5 and 6 illustrate system 10(3) after an occurrence of a breakdown in both first and second locations. In FIG. 5 a signal passes from first location 201, via wafer 200 and through second location 202. In FIG. 6 a signal passes from second location 202, via wafer 200 and through first location 201.

Figure 7:
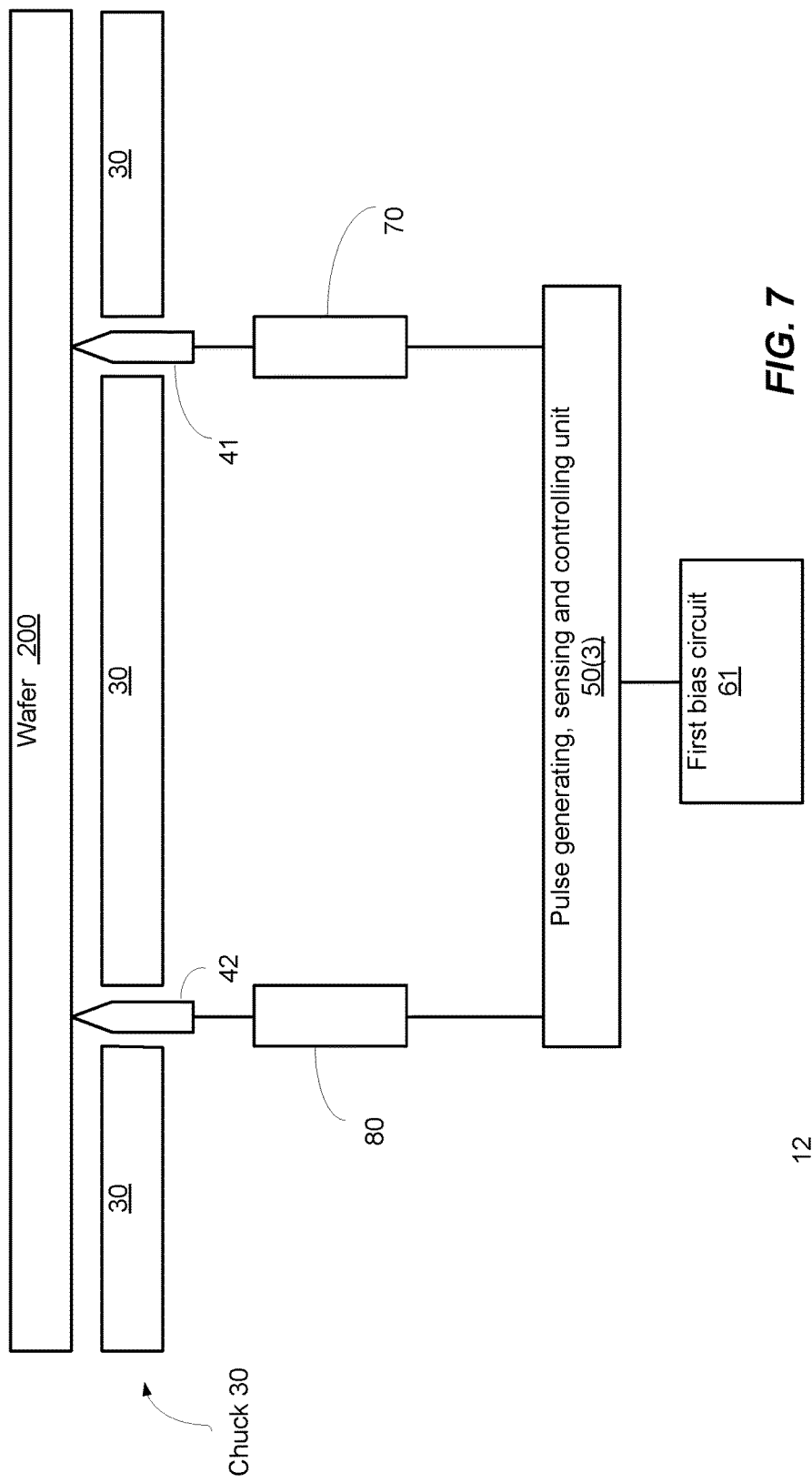
FIG. 7 illustrates a system and a wafer according to an embodiment of the invention.

FIG. 7 illustrates the pulse generating, sensing and controlling unit 50(3) is biased by first bias circuit 61. The first bias circuit may bias each one of units 50(1), 50(2), 50(3) and 50(4).

For simplicity of explanation various figures does not illustrate the chuck bias circuit 62 and the wafer bias circuit 63. Systems 12, 13, 14, 15 and 16 illustrates in FIGS. 7-14 may include chuck bias circuit 62 and/or wafer bias circuit 63.

Figure 8:
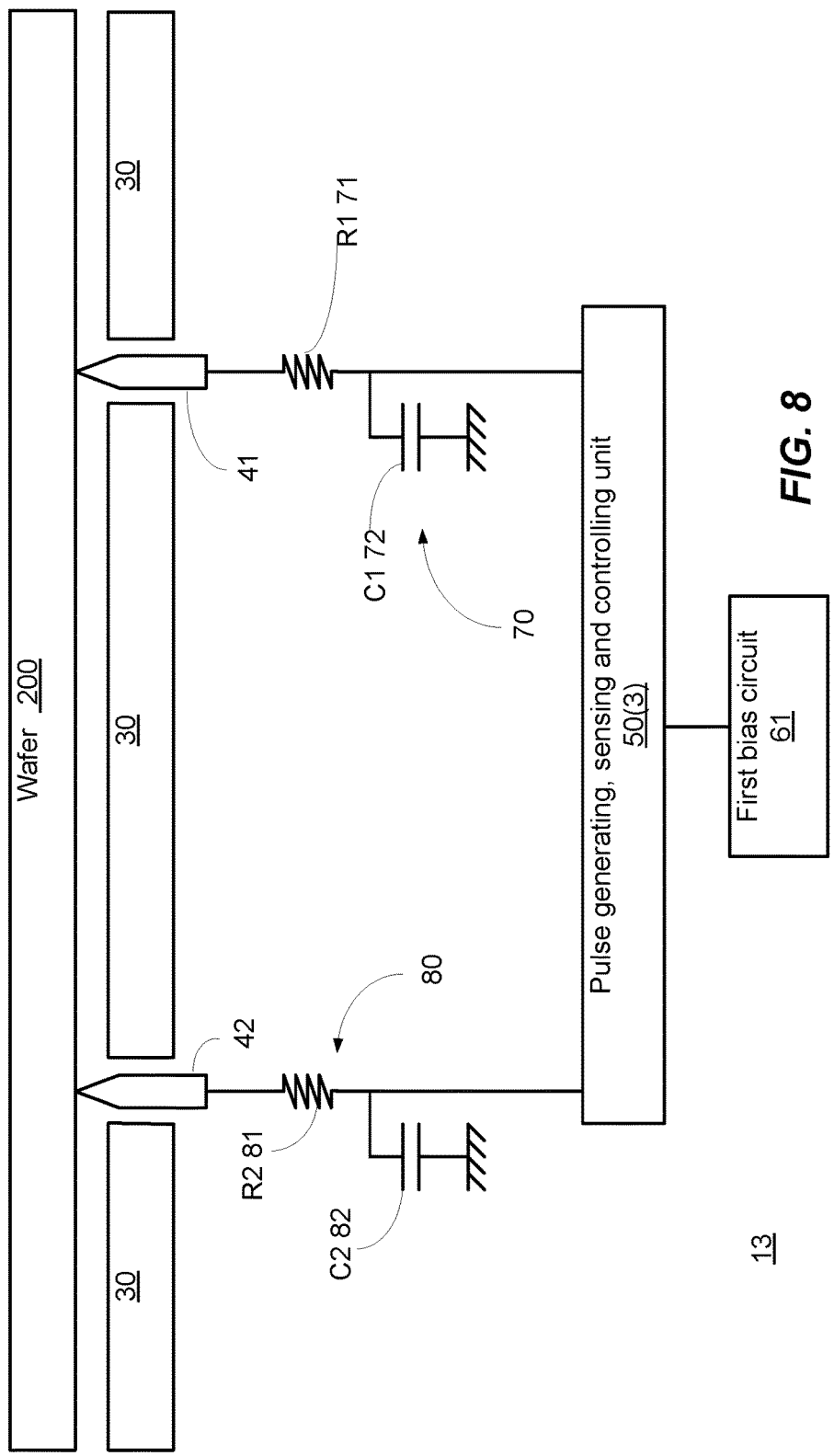
FIG. 8 illustrates a system and a wafer according to an embodiment of the invention.

FIG. 8 illustrates a system 13 and a wafer 200 according to an embodiment of the invention.

FIG. 8 illustrates the first network 70 as including a first resistor R1 71 and a first capacitor C1 72.

First resistor R1 71 is serially connected between the first conductive interface 41 and the pulse generator of pulse generating, sensing and controlling unit 50. First capacitor C1 72 is connected between first resistor R1 71 and the ground.

First resistor R1 71 limits the current that reaches the first conductive interface 41 and forms a resistive path between first conductive interface 41 and the pulse generator of pulse generating, sensing and controlling unit 50(3).

FIG. 8 illustrates the second network 80 as including a second resistor R2 81 and a second capacitor C2 82.

Second resistor R2 81 is serially connected between the second conductive interface 42 and the sensor of pulse generating, sensing and controlling unit 50(3). Second capacitor C1 72 is connected between second resistor R1 71 and the ground.

Figure 9:
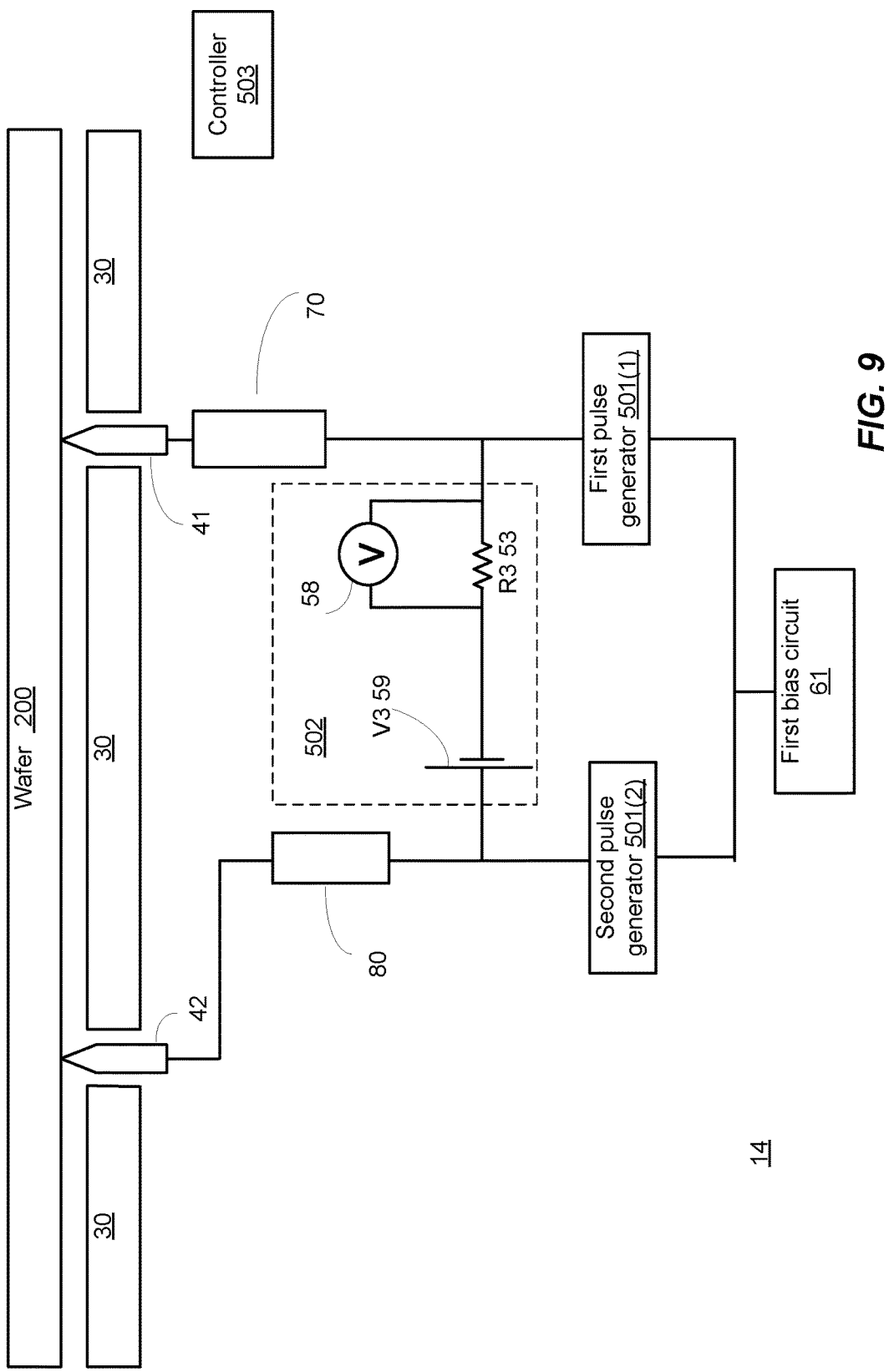
FIG. 9 illustrates a system and a wafer according to an embodiment of the invention.

FIG. 9 illustrates a system 14 and a wafer 200 according to an embodiment of the invention.

The pulse generating, sensing and controlling unit 50(3) includes controller 503, sensor 502, first pulse generator 501(1) and second pulse generator 501(2).

Sensor 502 is coupled between first network 70 and second network 80. Sensor 502 includes third resistor R3 53, voltmeter 58 coupled in parallel to the third resistor thereby measuring the voltage developed over third resistor RS 53. Sensor 502 also may include test signal source 59 for supplying test signals in order to test the occurrence of the breakdowns in the first and second locations.

The first pulse generator 501(1) is connected to the first bias circuit 61 on one end and to the first network 70 and sensor 502 on the other end.

The second pulse generator 501(2) is connected to the first bias circuit 61 on one end and to the second network 80 and sensor 502 on the other end.

Figure 10:
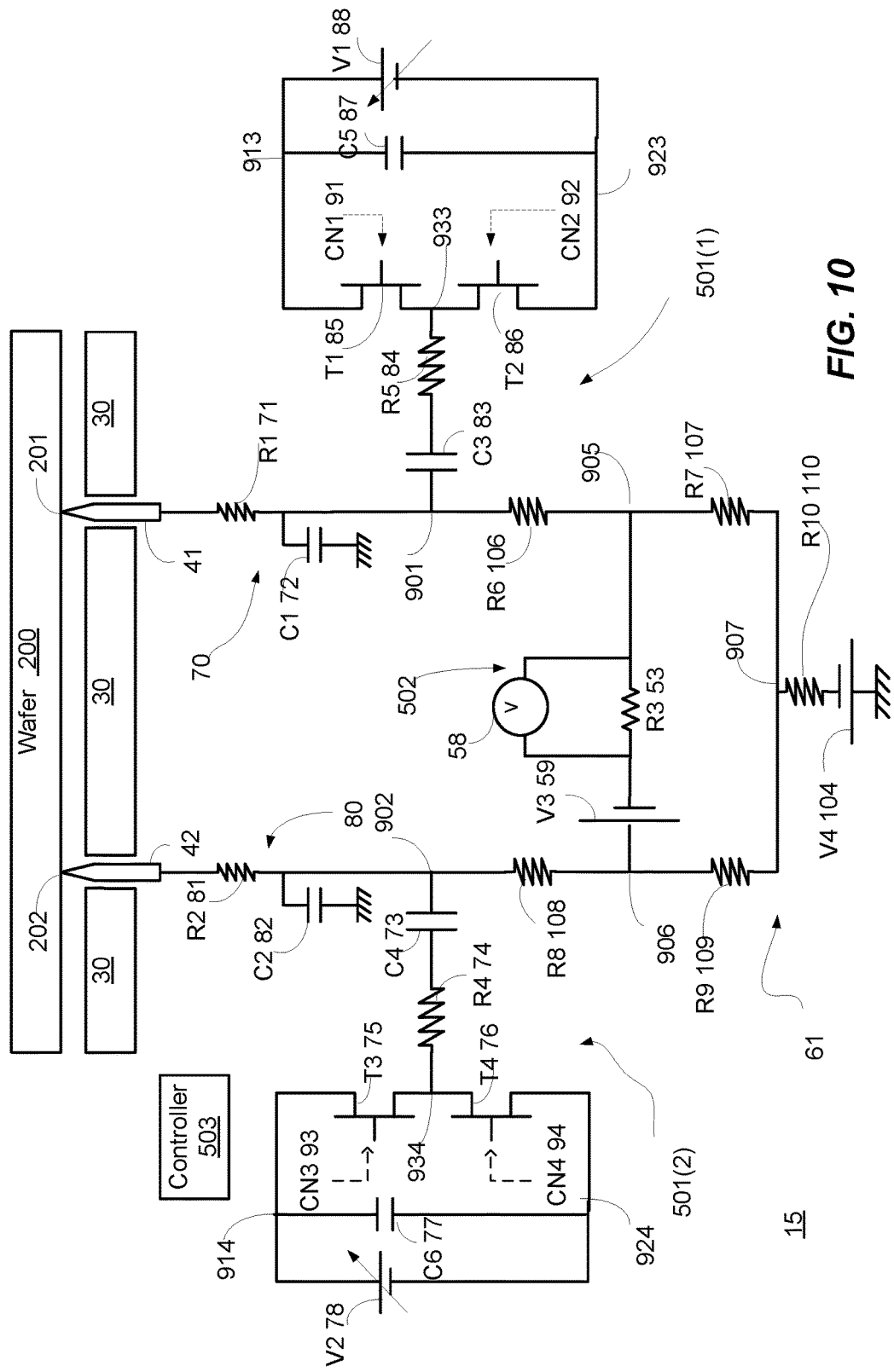
FIG. 10 illustrates a system and a wafer according to an embodiment of the invention.

FIG. 10 illustrates a system 15 and a wafer 200 according to an embodiment of the invention.

First conductive interface 41 is coupled between the first location 201 and first network 70. First network 70 is connected between first conductive interface 41 and first node 901. First node 901 is also connected to first pulse generator 501(1) and a first end of sixth resistor R6 106. A second end of sixth resistor R6 is connected to fifth node 905. Sensor 502 and first biasing circuit are also connected to fifth node 905.

Second conductive interface 42 is coupled between the second location 202 and second network 80. First network 70 is connected between second conductive interface 42 and second node 902. Second node 902 is also connected to second pulse generator 501(2) and a first end of eighth resistor R8 108. A second end of eighth resistor R8 is connected to sixth node 906. Sensor 502 and first biasing circuit are also connected to sixth node 906.

First network 70 includes a first resistor R1 71 and a first capacitor C1 72.

Second network 80 includes a second resistor R2 81 and a second capacitor C2 72.

First bias circuit 61 includes fourth supply unit 104, seventh resistor R7 107 and ninth resistor R9 109. Seventh node 907 is connected to fourth supply unit 104, to a second end of seventh resistor R7 107 and to a second end of ninth resistor R9 109. The first end of seventh resistor R7 107 is connected to sixth node 906. The first end of ninth resistor R9 109 is connected to fifth node 905.

Sensor 502 includes third resistor R3 53, voltmeter 58 coupled in parallel to the third resistor R3 53 and test signal source 59. Sixth node 906 is connected to test signal source 59 while fifth node 905 is connected to third resistor R5 53.

First pulse generator 501(1) includes third capacitor C3 83, fifth resistor 84, first transistor T1 85, second transistor T6 86, fifth capacitor C5 87 and first variable voltage supply unit V1 88. Fifth capacitor C5 87 and first variable voltage supply unit V1 88 are connected in parallel between nodes 913 and 923. First transistor T1 85 is connected to nodes 913 and 933. Second transistor T2 86 is connected to nodes 923 and 933.

Third capacitor C3 83 and fifth resistor 84 are serially connected between nodes 933 and 901.

First transistor T1 85 is controlled by first control signal CN1 91 that is sent from controller 503.

Second transistor T2 86 is controlled by second control signal CN2 92 that is sent from controller 503.

Second pulse generator 501(2) includes fourth capacitor C4 73, fifth resistor 84, third transistor T3 75, second transistor T6 86, sixth capacitor C6 77 and first variable voltage supply unit V1 88. Sixth capacitor C6 77 and first variable voltage supply unit V1 88 are connected in parallel between nodes 914 and 924. Third transistor T3 75 is connected to nodes 914 and 934. Fourth transistor T4 76 is connected to nodes 924 and 934.

Fourth capacitor C4 73 and fifth resistor 84 are serially connected between nodes 934 and 902.

Third transistor T3 75 is controlled by third control signal CN3 93 that is sent from controller 503.

Fourth transistor T4 76 is controlled by fourth control signal CN4 94 that is sent from controller 503.

First pulse generator 501(1) is configured to generate first zapping pulses by selectively opening and closing first transistor T1 85. The first zapping pulses pass through first transistor T1 85, third capacitor C3 83, fifth resistor R5 84, first resistor R1 71 and first conductive interface 41.

Second pulse generator 501(2) is configured to generate second zapping pulses by selectively opening and closing third transistor T3 75. The second zapping pulses pass through third transistor T3 75, fourth capacitor C4 73, fourth resistor R4 74, second resistor R2 81 and second conductive interface 42.

Non limiting examples of values of various electrical components illustrated in FIG. 10 are provided below:
  a. VS1 101 supplies a variable zapping voltage of up to 1000 Volts.
  b. VS3 103 supplies a bias voltage of 30 Kilovolts.
  c. R2 81 and R1 71 are 50K Ohm resistors.
  d. C1 72, C2 82 are 1 microfarad capacitors.

Figure 11:
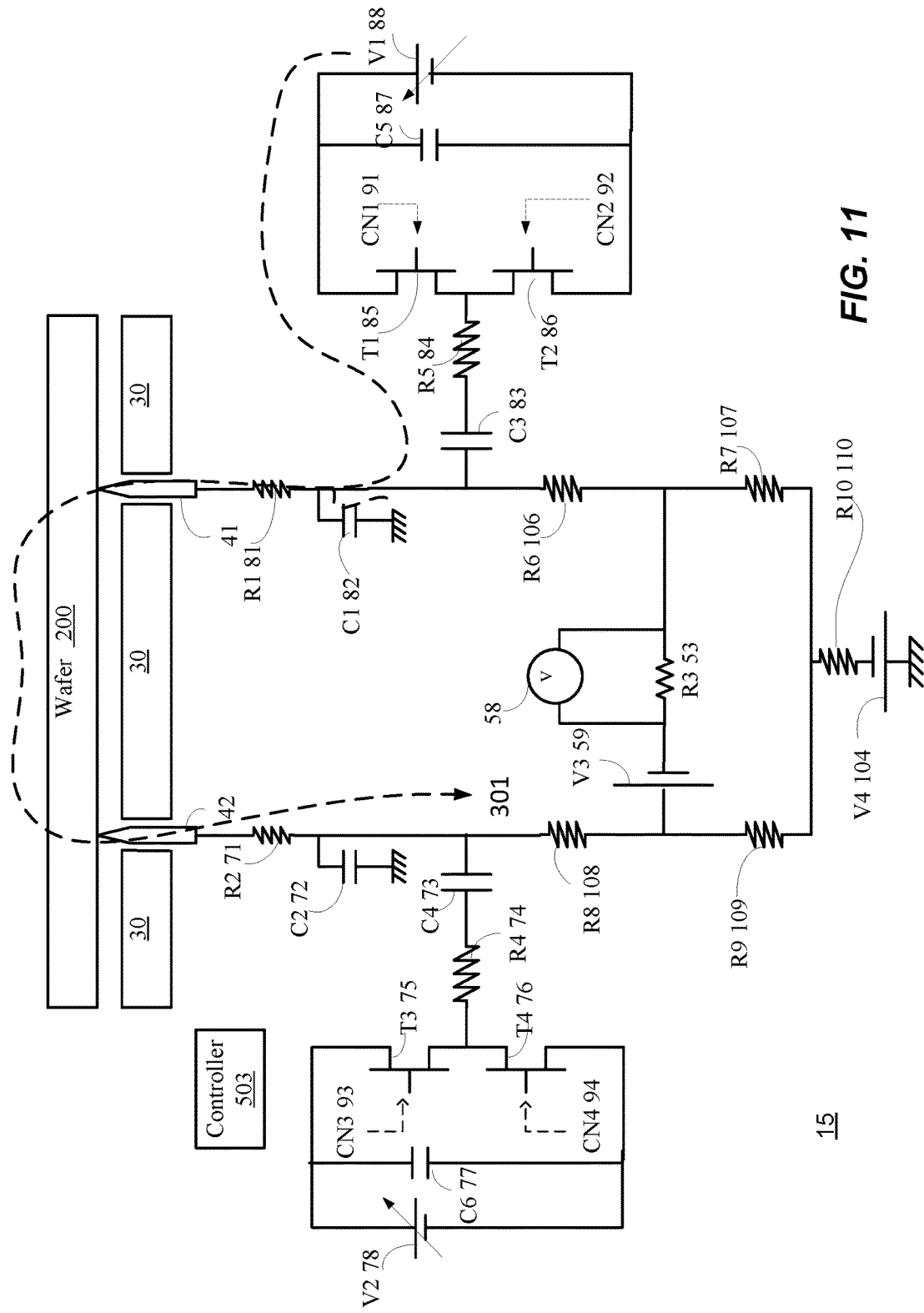
FIG. 11 illustrates a system and a wafer according to an embodiment of the invention.

FIG. 11 illustrates the path of a first zapping pulse after breakdowns occurred in both first location 201 and second location 202 of the backside insulating layer of the wafer.

Figure 12:
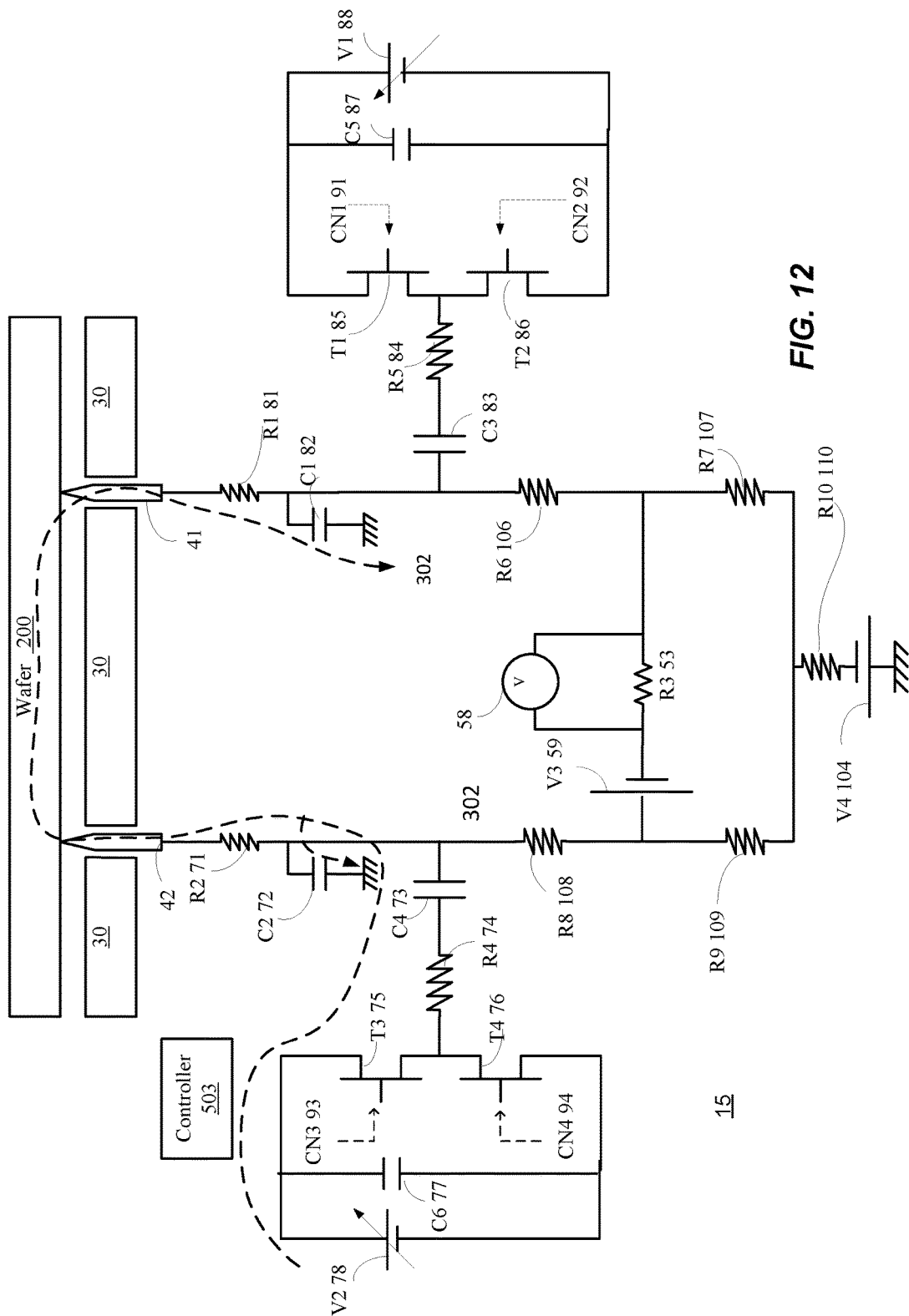
FIG. 12 illustrates a system and a wafer according to an embodiment of the invention.

FIG. 12 illustrates the path of a second zapping pulse after breakdowns occurred in both first location 201 and second location 202 of the backside insulating layer of the wafer.

Figure 13:
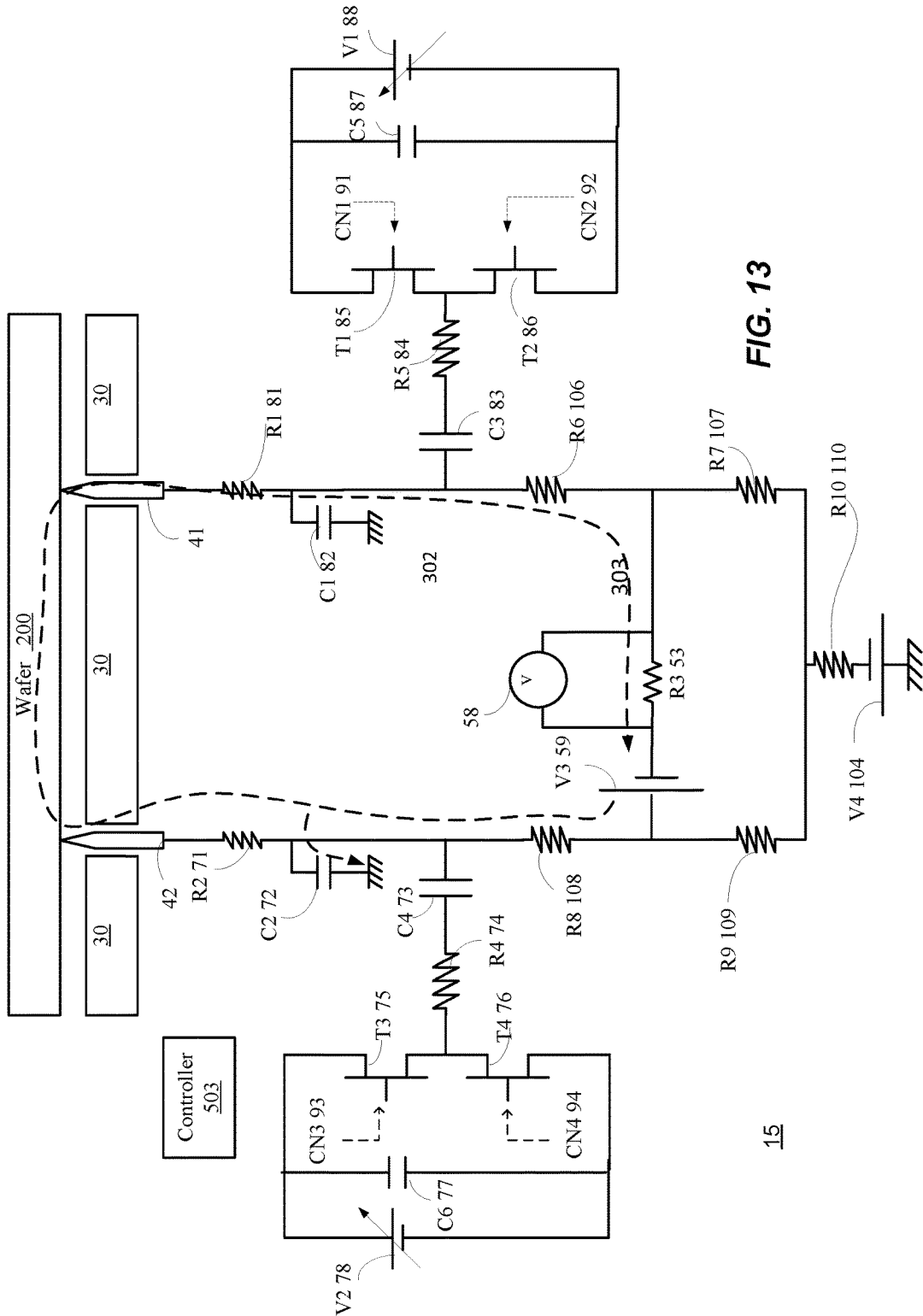
FIG. 13 illustrates a system and a wafer according to an embodiment of the invention.

FIG. 13 illustrates the path of a test signal sent from test signal source 59 after breakdowns occurred in both first location 201 and second location 202 of the backside insulating layer of the wafer.

Figure 14:
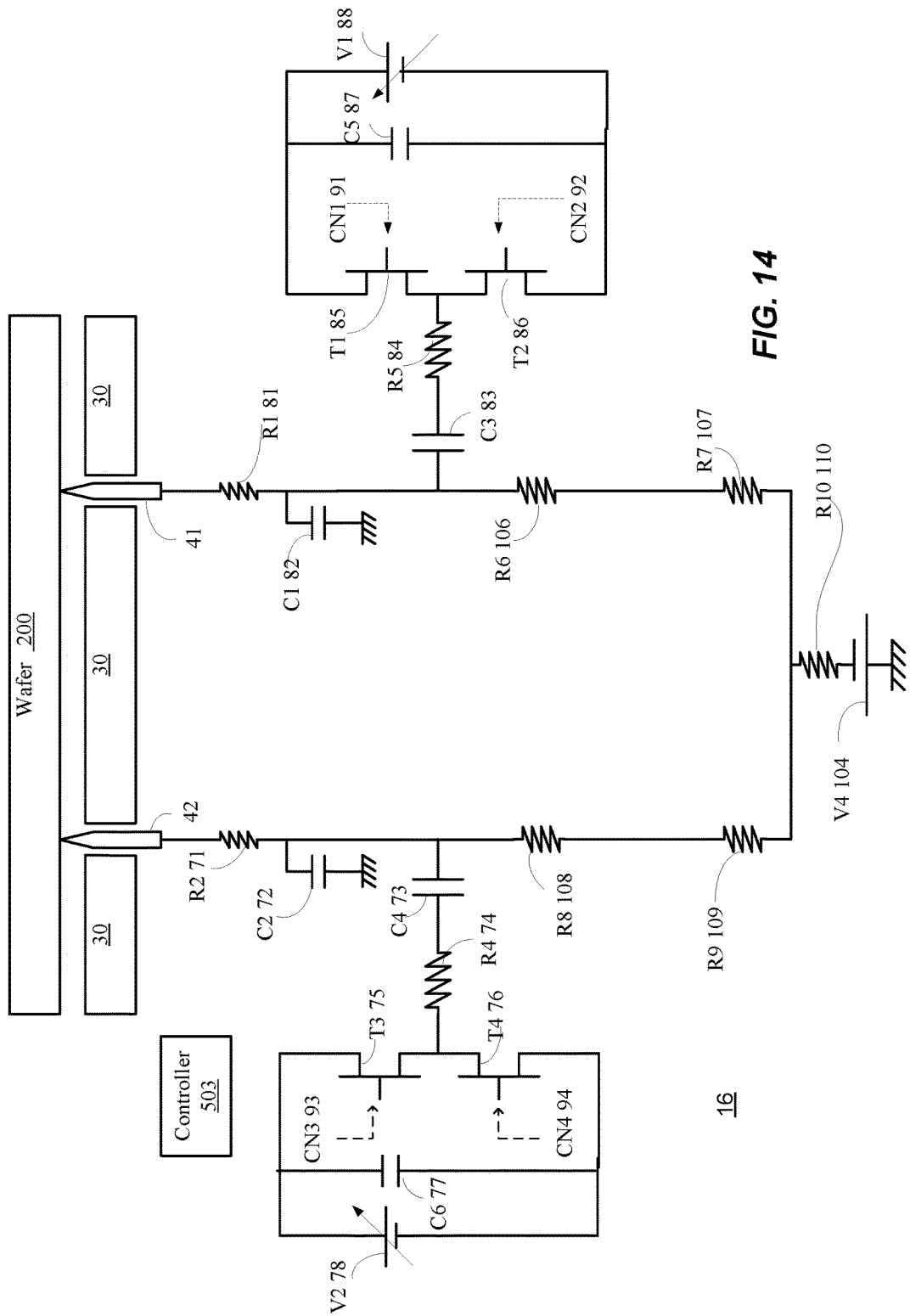
FIG. 14 illustrates a system and a wafer according to an embodiment of the invention.

FIG. 14 illustrates a system 16 and a wafer 200 according to an embodiment of the invention.

System 16 differs from system 15 by not including sensor 502.

Figure 15:
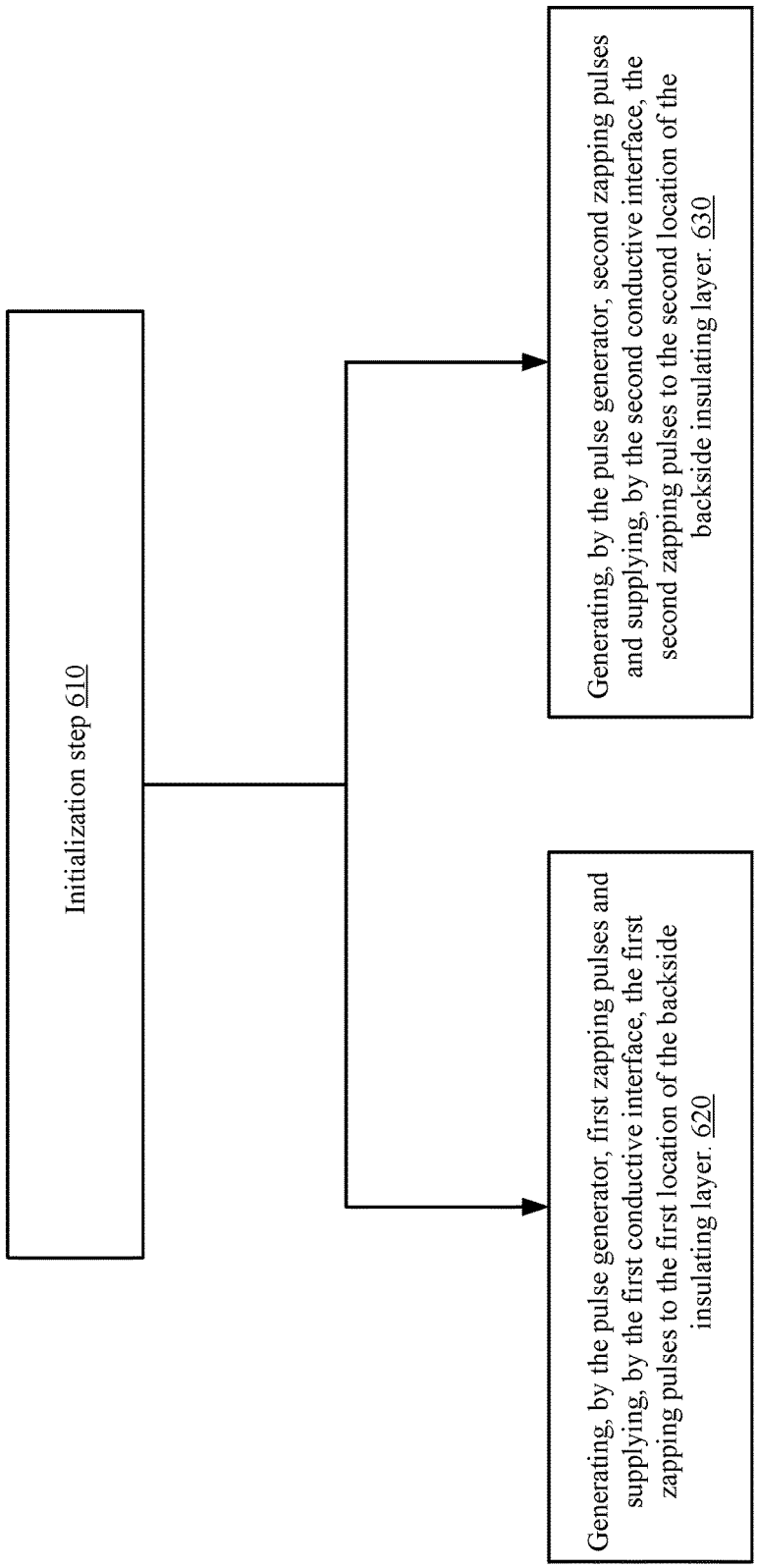
FIG. 15 illustrates a method according to an embodiment of the invention.

FIG. 15 illustrates a method 600 according to an embodiment of the invention.

Method 600 may start by initialization step 610.

Initialization step 610 may include at least some of the following steps:
  a. Placing the wafer on an electromagnetic chuck.
  b. Biasing the wafer.
  c. Biasing the chuck.
  d. Contacting a first location of backside insulating layer of the wafer by a first conductive interface.
  e. Contacting a second location of the backside insulating layer by a second conductive interface.

Initialization step 610 may be followed by steps 620 and 630.

Step 620 may include generating, by the pulse generator, first zapping pulses and supplying, by the first conductive interface, the first zapping pulses to the first location of the backside insulating layer.

Step 630 may include generating, by the pulse generator, second zapping pulses and supplying, by the second conductive interface, the second zapping pulses to the second location of the backside insulating layer.

Steps 620 and 630 may be executed in parallel to each other, in a serial manner or in a partially overlapping manner.

Steps 620 and 630 may be executed until an occurrence of a breakdown in the first and second locations. The occurrence of the breakdown in the first and second locations may be estimated based on previous zapping results, based on an analysis of the zapping pulses and the backside insulating layer, and the like.

Figure 16:
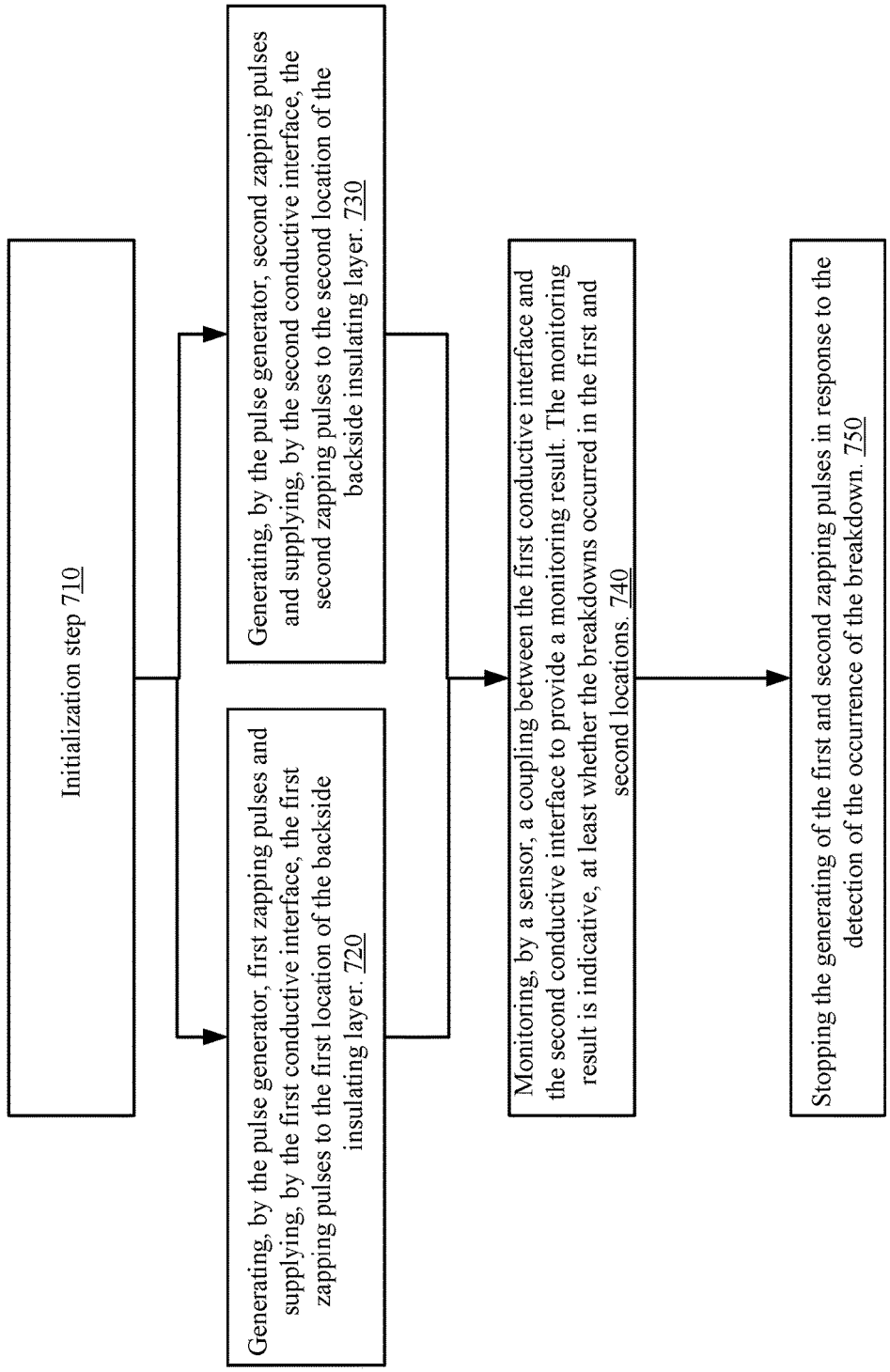
FIG. 16 illustrates a method according to an embodiment of the invention.

FIG. 16 illustrates a method 700 according to an embodiment of the invention.

Method 700 may start by initialization step 610.

Initialization step 710 may include at least some of the following steps:
  a. Placing the wafer on an electromagnetic chuck.
  b. Biasing the wafer.
  c. Biasing the chuck.
  d. Contacting a first location of backside insulating layer of the wafer by a first conductive interface.
  e. Contacting a second location of the backside insulating layer by a second conductive interface.

Initialization step 610 may be followed by steps 720 and 730.

Step 720 may include generating, by the pulse generator, first zapping pulses and supplying, by the first conductive interface, the first zapping pulses to the first location of the backside insulating layer.

Step 730 may include generating, by the pulse generator, second zapping pulses and supplying, by the second conductive interface, the second zapping pulses to the second location of the backside insulating layer.

Steps 720 and 730 may be executed in parallel to each other, in a serial manner or in a partially overlapping manner.

Steps 720 and 730 may be followed by step 740 of monitoring, by a sensor, a coupling between the first conductive interface and the second conductive interface to provide a monitoring result. The monitoring may occur while the second conductive interface contacts the second location and the first conductive interface contacts the first location. The monitoring result is indicative, at least whether the breakdowns occurred in the first and second locations.

Step 740 may be followed by step 750 of stopping the generating of the first and second zapping pulses in response to the detection of the occurrence of the breakdown.

The stopping may occur within few (one till twenty) nanoseconds, within few microseconds and the like.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system for zapping a wafer, the system comprising:
    a pulse generation unit that is configured to generate (a) first zapping pulses for causing a breakdown in a first location of a backside insulating layer of a wafer, and (b) second zapping pulses for causing a breakdown in a second location of the backside insulating layer of the wafer different than the first location;
    a first conductive interface that is configured to convey the first zapping pulses to the first location, while contacting the first location;
    a second conductive interface that is configured to convey the second zapping pulses to the second location, while contacting the second location; and
    a controller that is configured to control at least one out of an intensity of the zapping pulses, duration of the zapping pulses and an interval between adjacent zapping pulses.

2. The system according to claim 1 further comprising a sensor that is configured to monitor a coupling between the first conductive interface and the second conductive interface to provide a monitoring result; and wherein the sensor is configured to monitor the coupling occurs while the second conductive interface contacts the second location and the first conductive interface contacts the first location.

3. The system according to claim 1 further comprising a sensor that is configured to monitor a coupling between the first conductive interface and the second conductive interface by sensing electrical signals that pass through the second conductive interface due to the first zapping pulses.

4. The system according to claim 1 further comprising a sensor that is configured to monitor a coupling between the first conductive interface and the second conductive interface by sensing electrical signals that pass through the first conductive interface due to the second zapping pulses.

5. The system according to claim 1 further comprising a sensor that is configured to monitor a coupling between the first conductive interface and the second conductive interface by sensing test signals that differ from the first zapping pulses and the second zapping pulses.

6. The system according to claim 1 wherein the first conductive interface is coupled to the pulse generation unit via a resistor that is configured to limit a current of the zapping pulses below a predefined current threshold.

7. The system according to claim 1 wherein the first conductive interface is coupled to the pulse generation unit or via a resistive path.

8. The system according to claim 1 further comprising an electrostatic chuck for supporting the wafer; and wherein the first conductive interface and the second conductive interface are configured to pass through holes formed in the electrostatic chuck.

9. The system according to claim 1 wherein the controller is configured to control an intensity of the zapping pulses.

10. The system according to claim 1 wherein the controller is configured to control a duration of the zapping pulses.

11. The system according to claim 1 wherein the controller is configured to control an interval between adjacent zapping pulses.

12. A method for zapping a wafer, the method comprising:
    generating, by a pulse generation unit, first zapping pulses and second zapping pulses;
    supplying, by a first conductive interface, the first zapping pulses to a first location of a backside insulating layer of a wafer thereby causing a breakdown of the backside insulating layer in the first location;
    supplying, by a second conductive interface, the second zapping pulses to a second location of the backside insulating layer of a wafer thereby causing a breakdown of the backside insulating layer in the second location;
    monitoring, by a sensor, a coupling between the first conductive interface and the second conductive interface to provide a monitoring result; and
    controlling, by a controller, the generating of the first zapping pulses and the second zapping pulses in response to the monitoring result.

13. The method according to claim 12 wherein the controlling of the generating of the first zapping pulses and the second zapping pulses comprises stopping the generation of the first zapping pulses and the second zapping pulses when the monitoring result indicates that there is a breakdown in the first and second locations.

* * * * *